United States Patent
Tsai et al.

(10) Patent No.: US 9,118,018 B2
(45) Date of Patent: Aug. 25, 2015

(54) FLEXIBLE TRANSPARENT CONDUCTIVE FILM, LED FLEXIBLE TRANSPARENT DISPLAY STRUCTURE USING THE FILM, AND METHOD FOR FORMING THE DISPLAY STRUCTURE

(75) Inventors: Tsung-Yen Tsai, NewTaipei (TW); Chia-Chien Chin, NewTaipei (TW); Yu-An Li, NewTaipei (TW); Shieh-Heng Lee, NewTaipei (TW)

(73) Assignee: ELITE OPTOELECTRONIC CO., LTD., New Taipei (TW)

( * ) Notice: Subject to any disclaimer, the term of this patent is extended or adjusted under 35 U.S.C. 154(b) by 383 days.

(21) Appl. No.: 13/481,112

(22) Filed: May 25, 2012

(65) Prior Publication Data
US 2013/0292648 A1 Nov. 7, 2013

(30) Foreign Application Priority Data
May 4, 2012 (TW) ............... 101116069 A

(51) Int. Cl.
*H01L 51/00* (2006.01)
*H01B 1/24* (2006.01)
*H01L 25/075* (2006.01)
*H01L 33/42* (2010.01)
*H01L 51/50* (2006.01)

(52) U.S. Cl.
CPC .............. *H01L 51/0037* (2013.01); *H01B 1/24* (2013.01); *H01L 51/0021* (2013.01); *H01L 51/0036* (2013.01); *H01L 25/0753* (2013.01); *H01L 33/42* (2013.01); *H01L 51/5056* (2013.01); *H01L 2924/0002* (2013.01)

(58) Field of Classification Search
CPC ................. H01L 2924/12041; H01L 27/3244; H01L 51/5203; H01L 51/5012; H01L 51/0037; H01L 51/0036; H01L 51/0021
USPC ................................. 257/79, 81, 99
See application file for complete search history.

(56) References Cited

U.S. PATENT DOCUMENTS

| | | | |
|---|---|---|---|
| 8,908,125 B2 * | 12/2014 | Fujita | 349/70 |
| 2011/0175098 A1 * | 7/2011 | Ono et al. | 257/59 |
| 2012/0100647 A1 * | 4/2012 | Kim et al. | 438/28 |

* cited by examiner

*Primary Examiner* — Jose R Diaz
(74) *Attorney, Agent, or Firm* — WPAT, PC; Justin King

(57) ABSTRACT

A conductive material having a mixture of PEDOT:PSS is provided. The conductive material can be used to form a flexible transparent conductive film. Furthermore, various LED-type flexible transparent displays can be formed by the flexible transparent conductive film.

18 Claims, 13 Drawing Sheets

FLEXIBLE TRANSPARENT CONDUCTIVE FILM, LED FLEXIBLE TRANSPARENT DISPLAY STRUCTURE USING THE FILM, AND METHOD FOR FORMING THE DISPLAY STRUCTURE

BACKGROUND OF THE INVENTION

1. Field of the Invention

The present invention relates to a transparent conductive film, and more particularly, to a flexible transparent conductive film, a LED flexible transparent display structure using the film, and a method for forming the display structure.

2. Description of the Prior Art

A dispersion formed of poly(3,4-ethylenedioxythiophene) (PEDOT) and poly(styrenesulfonate) (PSS) is called PEDOT:PSS. The role of PSS is to maintain solubility and stability of PEDOT in the solution. Also, PEDOT is able to polymerize under the presence of PSS. During polymerization, oxide is doped to form PEDOT:PSS, creating a charged polymer capable of conducting holes.

In a well-known LED structure, the mixture of PEDOT and PSS (PEDOT:PSS) is used as the material for a conductive transparent polymer layer. However, the transparency of PEDOT:PSS is not excellent, even to the extent of exhibiting dark blue chroma. It also lacks some mechanical properties such as wear resistance, so it has to be coated on hard substrate, usually ITO, which offers mechanical support. For current industries, applications of these prior-art techniques can no longer meet the demands of our daily life, especially, the demand for flexibility. Although transparent and flexible synthetic resins such as polyamide, poly(ethylene terephthalate), polycarbonate, polyethylene and polyvinyl chloride are currently used as flexible substrates, hard materials like ITO are mostly employed as the electrode substrates, which hinders the overall flexibility of the design. Moreover, as mentioned before, PEDOT:PSS itself has good conductivity, but lacks transparency and stability due to resistance drift. Thus, it cannot be used as a commercial replacement for ITO, but ITO has poor flexibility. Thus, there is still a need in the industry to provide a LED transparent flexible display structure that overcomes the shortcomings in the prior art.

SUMMARY OF THE INVENTION

In view of the above background and special requirements of the industry, the present invention provides a flexible transparent conductive film, a LED display structure using the film, and the method for forming the LED display structure, which address the issues that are not yet solved in the prior art.

An objective of the present invention is to provide a conductive material including PEDOT:PSS/graphite structure/silicon oxide to form a flexible transparent conductive film. The graphite structure reduces conductive resistance, stabilize impedance and increase environmental stability (e.g. temperature and/or moisture resistance), while the silicon oxide increases the adhesion of the conductive material to prevent resistance drift caused by damage to the surface material of the conductive film due to deflection or friction. Accordingly, the flexible transparent conductive film formed by the conductive material of the present invention has high flexibility, higher transparency, high conductivity, low resistance, as well as improved mechanical properties such as better wear resistance and higher adhesion.

Another objective of the present invention is to form a transparent conductive layer using said conductive material, thereby forming a LED flexible transparent display structure, which has characteristics such as high flexibility, higher transparency, better wear resistance, high conductivity and stable resistance. As a result, it can be widely used in the LED-related industry.

According to the above objectives of the present invention, the present invention provides a conductive material, which includes a mixture of poly(3,4-ethylenedioxythiophene) and poly(styrenesulfonate) (PEOT:PSS); a graphite structure; and silicon oxide. The PEOT:PSS mixture makes up about 30% to 70% of the conductive material; the graphite structure makes up about 15% to 35% of the conductive material; and the silicon oxide makes up about 15% to 35% of the conductive material. Preferably, the PEOT:PSS mixture makes up about 50% to 60% of the conductive material; the graphite structure makes up about 20% to 25% of the conductive material; and the silicon oxide makes up about 20% to 25% of the conductive material. The graphite structure may further include graphene.

The above conductive material according to the present invention can be used to form a flexible transparent conductive film. A method for forming the flexible transparent conductive film includes performing a coating process to coat the conductive material on a surface of a flexible transparent substrate; and performing a curing process to form the flexible transparent conductive film on surface of the flexible transparent substrate.

According to the above objectives of the present invention, the present invention also provides a light emitting diode (LED) display structure, which includes at least one transparent substrate; at least one first transparent conductive region and at least one second transparent conductive region spatially orthogonal to each other, forming at least one spatial intersection in space; and at least one LED respectively electrically coupled to the at least one first transparent conductive region and at least one second transparent conductive region. The material of the at least one transparent substrate may include polyethylene terephthalate (PET). The at least one first transparent conductive region and the at least one second transparent conductive region are formed by a conductive material including a mixture of poly(3,4-ethylenedioxythiophene) and poly(styrenesulfonate) (PEOT:PSS), a graphite structure and silicon oxide. The PEOT:PSS mixture makes up about 30% to 70% of the conductive material; the graphite structure makes up about 15% to 35% of the conductive material; and the silicon oxide makes up about 15% to 35% of the conductive material. Preferably, the PEOT:PSS mixture makes up about 50% to 60% of the conductive material; the graphite structure makes up about 20% to 25% of the conductive material; and the silicon oxide makes up about 20% to 25% of the conductive material. The graphite structure may further include graphene.

The above LED display structure may further include the at least one transparent substrate including a first transparent substrate and a second transparent substrate; and a receiving space between a first surface of the first transparent substrate and a second surface of the second transparent substrate, and the at least one first transparent conductive region and the at least one second transparent conductive region respectively located on the first surface and the second surface opposite to each other in the receiving space, wherein the spatial intersection is in the receiving space, and the at least one LED is on the spatial intersection. The receiving space is filled with a transparent insulating layer.

The above LED display structure may further include the at least one transparent substrate including a first transparent substrate and a second transparent substrate, and the at least one first transparent conductive region located on a first surface of the first transparent substrate, wherein the first surface is opposite to a third surface of the first transparent substrate; a receiving space formed between a second surface of the second transparent substrate and the third surface of the first transparent substrate, wherein the spatial intersection is in the receiving space; at least one third transparent conductive region located on the same second surface in the receiving space with the at least one second transparent conductive region; the at least one LED located in a gap between the at least one third transparent conductive region and the at least one second transparent conductive region on the second surface of the second transparent substrate, wherein two electrodes of the at least one LED are electrically coupled to the at least one third transparent conductive region and the at least one second transparent conductive region, respectively; and at least one channel sequentially penetrating the at least one first transparent conductive region and the first transparent substrate and corresponding to the location of the at least one third transparent conductive region, and the at least one first transparent conductive region and the at least one third transparent conductive region being electrically coupled via the at least one channel. The at least one third transparent conductive region and the at least one second transparent conductive region are interspersed and spaced apart, and the number of the at least one third transparent conductive region equals to the number of the at least one second transparent conductive region. The receiving space further includes a transparent insulating layer through which the at least one channel also penetrates. The channel further includes a conductive filler.

The above LED display structure may further include the at least one first transparent conductive region located on a first surface of the at least one transparent substrate, wherein the first surface is opposite to a second surface of the at least one transparent substrate; at least one third transparent conductive region located on the same second surface with the at least one second transparent conductive region; the at least one LED located in a gap between the at least one third transparent conductive region and the at least one second transparent conductive region on the second surface of the at least one transparent substrate, wherein two electrodes of the at least one LED are electrically coupled to the at least one third transparent conductive region and the at least one second transparent conductive region, respectively; and at least one channel sequentially penetrating the at least one first transparent conductive region, the transparent substrate and the at least one third transparent conductive region, and the at least one first transparent conductive region and the at least one third transparent conductive region being electrically coupled via the at least one channel. The at least one third transparent conductive region and the at least one second transparent conductive region are interspersed and spaced apart, and the number of the at least one third transparent conductive region equals to the number of the at least one LED. The channel further includes a conductive filler.

The above LED display structure may further include the at least one first transparent conductive region located on a first surface of the at least one transparent substrate, and the at least one second transparent conductive region located on a second surface of the at least one transparent substrate, wherein the first surface is opposite to the second surface; the at least one LED located on the at least one second transparent conductive region, and an electrode of the at least one LED is electrically coupled to the at least one second transparent conductive region; and at least one channel sequentially penetrating the at least one first transparent conductive region and the transparent substrate, and located adjacent to the at least one second transparent conductive region, and the other electrode of the at least one LED and the at least one first transparent conductive region being electrically coupled via the at least one channel. At least one transparent insulating layer is provided on the location of the at least one channel on the second surface, and the at least one channel also penetrates the at least one transparent insulating layer.

According to the above objectives of the present invention, the present invention also provides a method for forming a light-emitting diode (LED) display structure, which includes forming a first transparent conductive layer and a second transparent conductive layer on specific surfaces of at least one transparent substrate; performing a lithography process on the first transparent conductive layer and the second transparent conductive layer to convert them into specific patterns, forming at least one first transparent conductive region and at least one second transparent conductive region spatially orthogonal to each other to form at least one spatial intersection; and forming at least one LED electrically coupled to the at least one first transparent conductive region and the at least one second transparent conductive region. The materials of the first transparent conductive layer and the second transparent conductive layer further include polyethylene terephthalate (PET). The first transparent conductive layer and the second transparent conductive layer are formed by a conductive material including a mixture of poly(3,4-ethylenedioxythiophene) and poly(styrenesulfonate) (PEOT:PSS), a graphite structure and silicon oxide. The PEOT:PSS mixture makes up about 30% to 70% of the conductive material; the graphite structure makes up about 15% to 35% of the conductive material; and the silicon oxide makes up about 15% to 35% of the conductive material. Preferably, the PEOT:PSS mixture makes up about 50% to 60% of the conductive material; the graphite structure makes up about 20% to 25% of the conductive material; and the silicon oxide makes up about 20% to 25% of the conductive material. The graphite structure may further include graphene.

The above method for forming a LED display structure further includes the at least one transparent substrate including a first transparent substrate and a second transparent substrate; forming the first transparent conductive layer and the second transparent conductive layer on surfaces of the first transparent substrate and the second transparent substrate; performing a lithography process on the first transparent conductive layer and the second transparent conductive layer to convert them into specific patterns, forming the at least one first transparent conductive region and the at least one second transparent conductive region on the first transparent substrate and the second transparent substrate; performing an implantation process to form the at least one LED on the at least one first transparent conductive region of the first transparent substrate; and performing an aligned adhering process to adhere the first transparent substrate and the second transparent substrate with a receiving space formed therebetween, wherein the at least one spatial intersection is in the receiving space, and the at least one LED is on the on the spatial intersection. The method further includes performing an insulating process to fill the receiving space with a transparent insulating layer, and performing a positioning step to form at least one recess in the at least one second transparent conductive region at a location corresponding to the at least one LED for receiving the at least one LED.

The above method for forming a LED display structure further includes the at least one transparent substrate including a first transparent substrate and a second transparent substrate; forming the first transparent conductive layer and the second transparent conductive layer on surfaces of the first transparent substrate and the second transparent substrate;

performing a lithography process on the first transparent conductive layer and the second transparent conductive layer to convert them into specific patterns, forming the at least one first transparent conductive region on the first transparent substrate, and the at least one second transparent conductive region and at least one third transparent conductive region on the second transparent substrate; performing an implantation process to form the at least one LED in a gap between the at least one third transparent conductive region and the at least one second transparent conductive region on the surface of the second transparent substrate, wherein two electrodes of the at least one LED are electrically coupled to the at least one third transparent conductive region and the at least one second transparent conductive region, respectively; performing a channeling process to sequentially penetrate the at least one first transparent conductive region and the first transparent substrate to form at least one channel, and the location of the at least one channel corresponding to the location of the at least one third transparent conductive region, and the at least one first transparent conductive region and the at least one third transparent conductive region being electrically coupled via the at least one channel; and performing an aligned adhering process to adhere the first transparent substrate and the second transparent substrate with a receiving space formed therebetween, wherein the at least one spatial intersection is in the receiving space, and the at least one channel is on the on the at least one spatial intersection. The method further includes performing an insulating process to fill the receiving space with a transparent insulating layer. The at least one third transparent conductive region and the at least one second transparent conductive region are interspersed and spaced apart, and the number of the at least one third transparent conductive region equals to the number of the at least one LED. The method further includes performing an electrically conducting process to fill the channel with a conductor.

The above method for forming a LED display structure further includes forming the first transparent conductive layer and the second transparent conductive layer on a first surface and a second surface of the at least one transparent substrate, respectively, wherein the first and the second surfaces are two surface opposite to each other; performing a lithography process on the first transparent conductive layer and the second transparent conductive layer to convert them into specific patterns, forming the at least one first transparent conductive region on the first surface of the at least one transparent substrate, and the at least one second transparent conductive region and at least one third transparent conductive region on the second surface of the at least one transparent substrate; performing a channeling process to sequentially penetrate the at least one first transparent conductive region, the at least one transparent substrate and the at least one third transparent conductive region to form at least one channel, and the at least one first transparent conductive region and the at least one third transparent conductive region being electrically coupled via the at least one channel; and performing an implantation process to form the at least one LED in a gap between the at least one third transparent conductive region and the at least one second transparent conductive region on the second surface of the at least one transparent substrate, wherein the at least one LED is electrically coupled to the at least one third transparent conductive region and the at least one second transparent conductive region. The at least one third transparent conductive region and the at least one second transparent conductive region are interspersed and spaced apart, and the number of the at least one third transparent conductive region equals to the number of the at least one LED. The method further includes performing an electrically conducting process to fill the at least one channel with a conductor. The order in which the implantation process and the channeling process are performed can be changed as needed.

The above method for forming a LED display structure further includes forming the first transparent conductive layer and the second transparent conductive layer on a first surface and a second surface of the at least one transparent substrate, respectively, wherein the first and the second surfaces are two surface opposite to each other; performing a lithography process on the first transparent conductive layer and the second transparent conductive layer to convert them into specific patterns, forming the at least one first transparent conductive region on the first surface of the at least one transparent substrate, and the at least one second transparent conductive region on the second surface of the at least one transparent substrate; performing a channeling process to sequentially penetrate the at least one first transparent conductive region and the at least one transparent substrate to form at least one channel adjacent to the at least one second transparent conductive region, and performing an implantation process to form the at least one LED on the at least one second transparent conductive region, wherein an electrode of the at least one LED is electrically coupled to the at least one second transparent conductive region, and the other electrode of the at least one LED is electrically coupled to the at least one first transparent conductive region. The method further includes performing an electrically conducting process to fill the at least one channel with a conductor. The order in which the implantation process and the channeling process are performed can be changed as needed. Before the channel process is performed, an insulating process can be performed to form at least one transparent dielectric layer between the at least one second transparent conductive region on the second surface of the transparent substrate, wherein the at least one channel sequentially penetrates the at least one first transparent conductive region, the transparent substrate and the transparent dielectric layer.

DETAILED DESCRIPTION OF THE PREFERRED EMBODIMENTS

Figure 1:
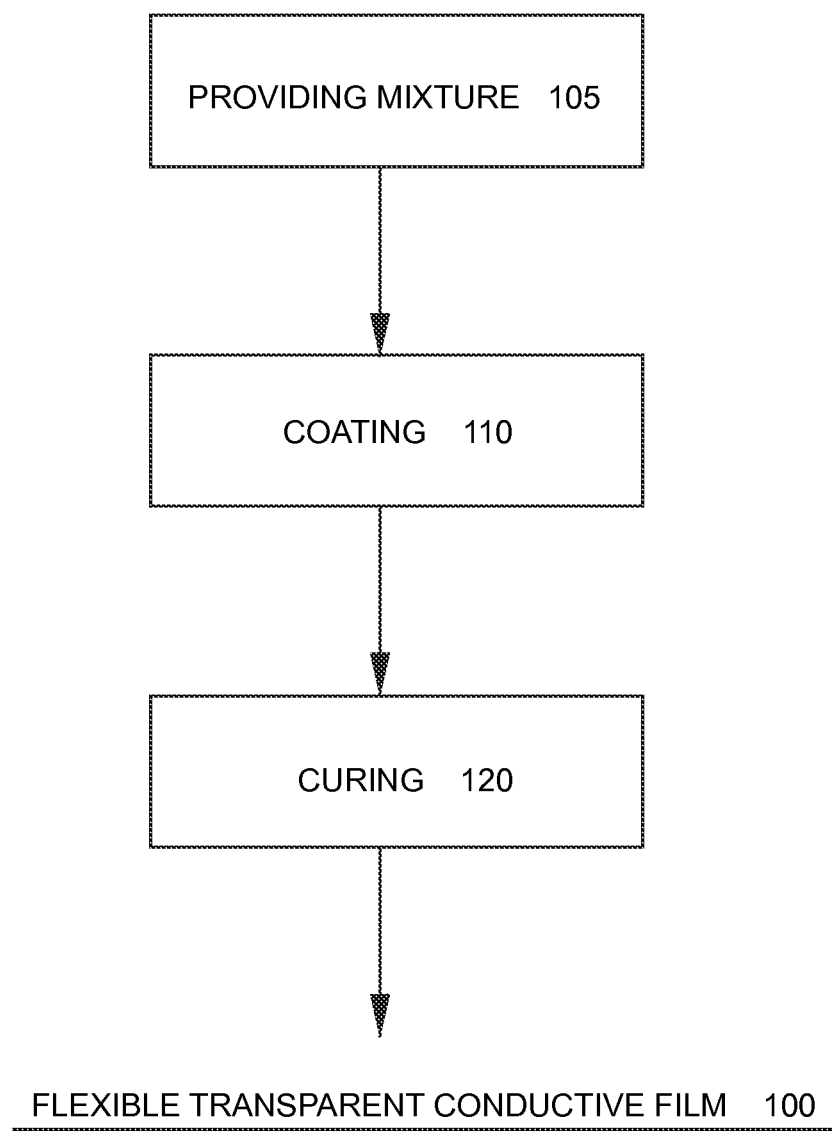
FIG. 1 shows a flexible transparent conductive film and the method for forming it according to a first embodiment of the present invention.

The present invention is directed to LED display structures. In order to facilitate understanding of the present invention, detailed structures and their elements and method steps are set forth in the following descriptions. Obviously, the implementations of the present invention are not limited to specific details known to those skilled in the art of LEDs. On the other hand, well-known structures and their elements are omitted herein to avoid unnecessary limitations on the present invention. In addition, for better understanding and clarity of the description by those skilled in the art, some components in the drawings may not necessary be drawn to scale, in which some may be exaggerated relative to others, and irrelevant parts are omitted. Preferred embodiments of the present invention are described in details below, in addition to these descriptions, the present invention can be widely applicable to other embodiments, and the scope of the present invention is not limited by such, rather by the scope of the following claims.

According to a first embodiment of the present invention, refer to FIG. 1, a flexible transparent conductive film 100 and a method for forming the film is provided. First, a conductive material 105 is provided. The conductive material 105 includes poly(3,4-ethylenedioxythiophene) poly(styrenesulfonate) (PEDOT:PSS), a graphite structure and silicon oxide. PEDOT:PSS is a mixture of poly(3,4-ethylenedioxythiophene) and poly(styrenesulfonate), which makes up about 30%-70%, preferably 50-60% of the conductive material; the graphite structure further includes graphene and makes up about 15%-35%, preferably 20%-25% of the conductive material; and silicon oxide makes up about 15%-35%, preferably 20%-25% of the conductive material. Then, a coating process 110 is performed to coat the conductive material 105 on a surface of a flexible transparent substrate 115. The substrate 115 includes polyethylene terephthalate (PET). Then, a curing process 120 is performed to form the flexible transparent conductive film 100 on the substrate surface.

Figure 2A:
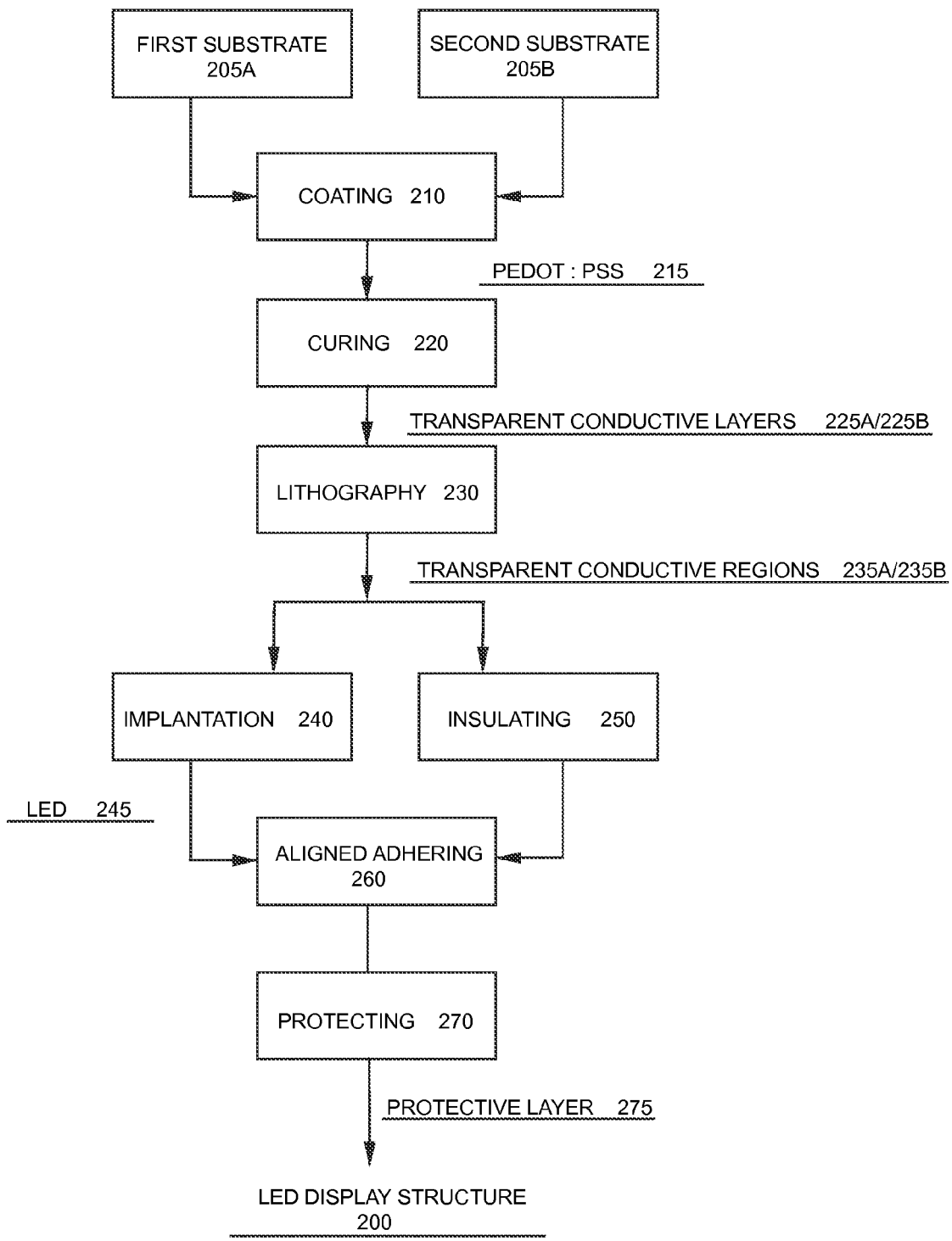
FIGS. 2A to 2C show a LED display structure and the method for forming it according to a second embodiment of the present invention.
Figure 2B:
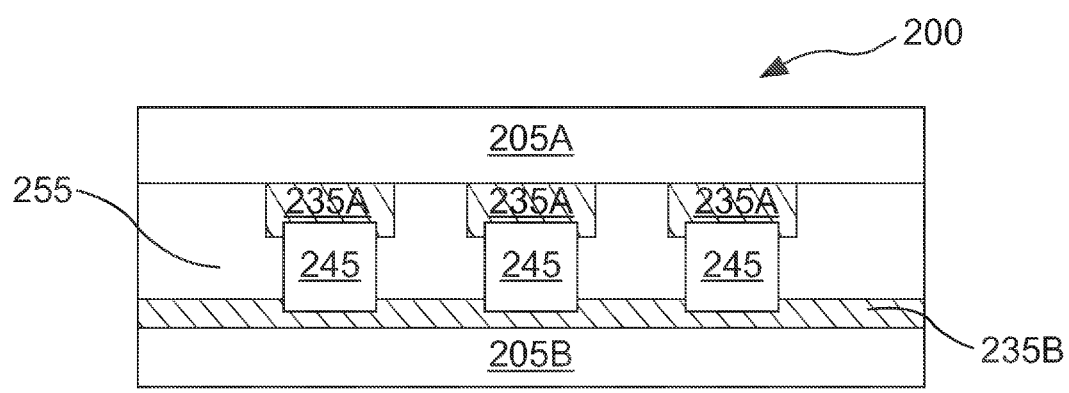

According to a second embodiment of the present invention, refer to FIGS. 2A and 2B, a LED display structure 200 and a method for forming it is provided. First, a first transparent substrate 205A and a second transparent substrate 205B are provided. The material of the first transparent substrate 205A and the second transparent substrate 205B includes PET. Then, a coating process 210 is performed to respectively coat a conductive material 215 on surfaces of the first transparent substrate 205A and the second transparent substrate 205B, wherein the conductive material 215 includes PEDOT:PSS, a graphite structure and silicon oxide. PEDOT:PSS is a mixture of poly(3,4-ethylenedioxythiophene) and poly(styrenesulfonate), which makes up about 30%-70%, preferably 50-60% of the conductive material 215; the graphite structure further includes graphene and makes up about 15%-35%, preferably 20%-25% of the conductive material 215; and silicon oxide makes up about 15%-35%, preferably 20%-25% of the conductive material 215.

Then, a curing process 220 is performed on the conductive material 215 coated on the first transparent substrate 205A and the second transparent substrate 205B to form a first transparent conductive layer 225A and a second transparent conductive layer 225B on the surfaces of first transparent substrate 205A and the second transparent substrate 205B, respectively, wherein the curing process 220 further includes a baking process. Thereafter, a lithography process 230 is performed on the first transparent conductive layer 225A and the second transparent conductive layer 225B to convert the first transparent conductive layer 225A and the second transparent conductive layer 225B into specific patterns, forming at least one first transparent conductive region 235A and at least one second transparent conductive region 235B on the first transparent substrate 205A and the second transparent substrate 205B, respectively, wherein the lithography process 230 further includes an etching step.

Then, an implantation process 240 is performed to form at least one LED 245 on the at least one first transparent conductive region 235A of the first transparent substrate 205A. Subsequently, an insulating process 250 is performed to form a transparent insulating layer 255 on the at least one second transparent conductive region 235B of the second transparent substrate 205B, wherein the insulating process 250 further includes a positioning step to form a hole at a corresponding location for receiving the at least one LED 245, and the transparent insulating layer 255 is an optical clear adhesive (OCA).

Figure 2C:
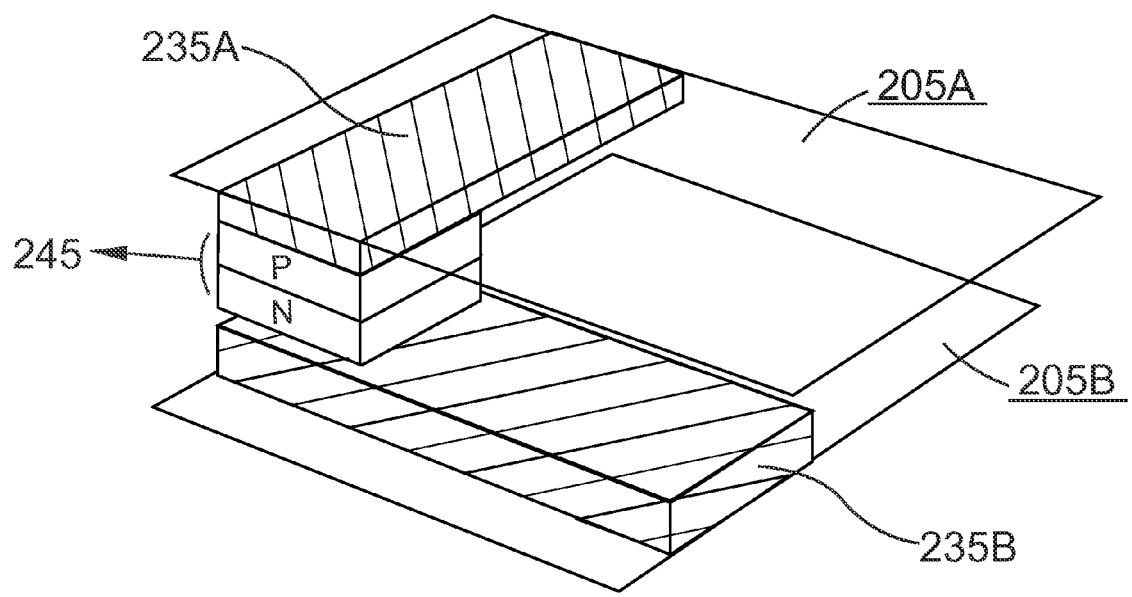

Then, an aligned adhering process 260 is performed to adhere the at least one LED 245 of the first transparent substrate 205A with the transparent insulating layer 255 of the second transparent substrate 205B, wherein the at least one first transparent conductive region 235A and the at least one second transparent conductive region 235B are spatially orthogonal to each other, forming at least one spatial intersection in space, and the at least one LED 245 is on the spatial intersection. Two electrodes of the at least one LED 245 are electrically coupled to the at least one first transparent conductive region 235A and the at least one second transparent conductive region 235B, respectively, thereby forming the LED display structure 200 as shown in FIG. 2C. Finally, a protecting process 270 is performed to form a transparent protective layer 275 on the overall surface of the LED display structure 200, wherein the material of the transparent protective layer 275 may include polyurethane (PU).

Figure 3A:
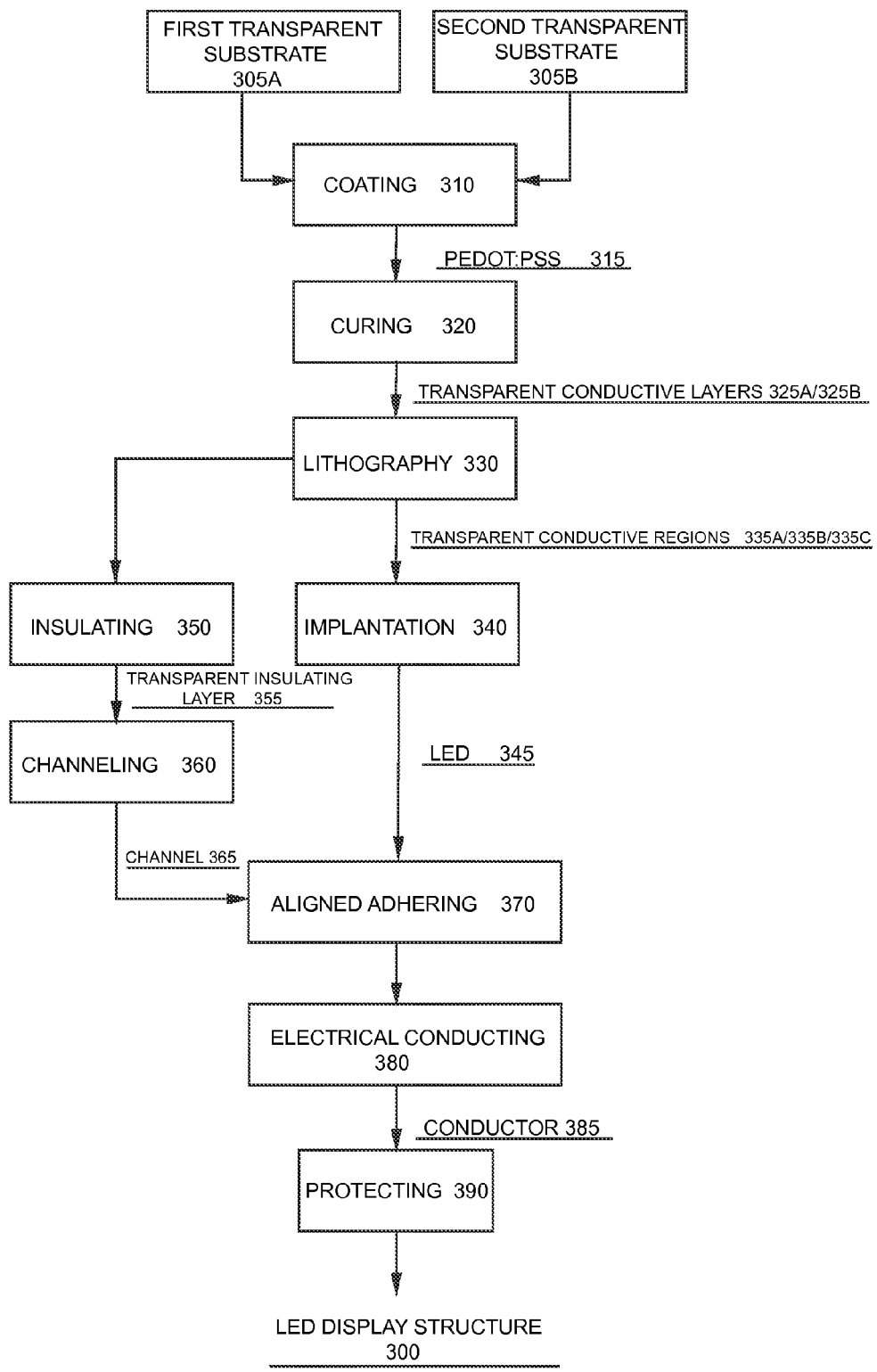
FIGS. 3A to 3C show a LED display structure and the method for forming it according to a third embodiment of the present invention.
Figure 3B:
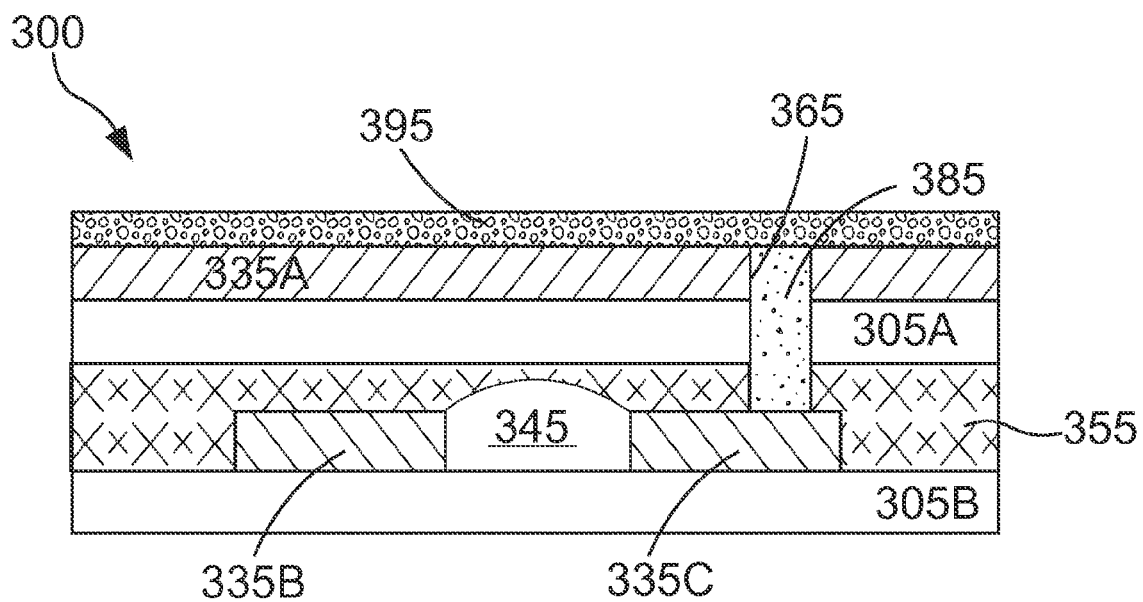

According to a third embodiment of the present invention, refer to FIGS. 3A and 3B, a LED display structure 300 and a method for forming it is provided. First, a first transparent substrate 305A and a second transparent substrate 305B are provided. The material of the first transparent substrate 305A and the second transparent substrate 305B includes PET. Then, a coating process 310 is performed to respectively coat a conductive material 315 on surfaces of the first transparent substrate 305A and the second transparent substrate 305B, wherein the conductive material 315 includes PEDOT:PSS, a graphite structure and silicon oxide. PEDOT:PSS is a mixture of poly(3,4-ethylenedioxythiophene) and poly(styrenesulfonate), which makes up about 30%-70%, preferably 50-60% of the conductive material 315; the graphite structure further includes graphene and makes up about 15%-35%, preferably 20%-25% of the conductive material 315; and silicon oxide makes up about 15%-35%, preferably 20%-25% of the conductive material 315.

Figure 3C:
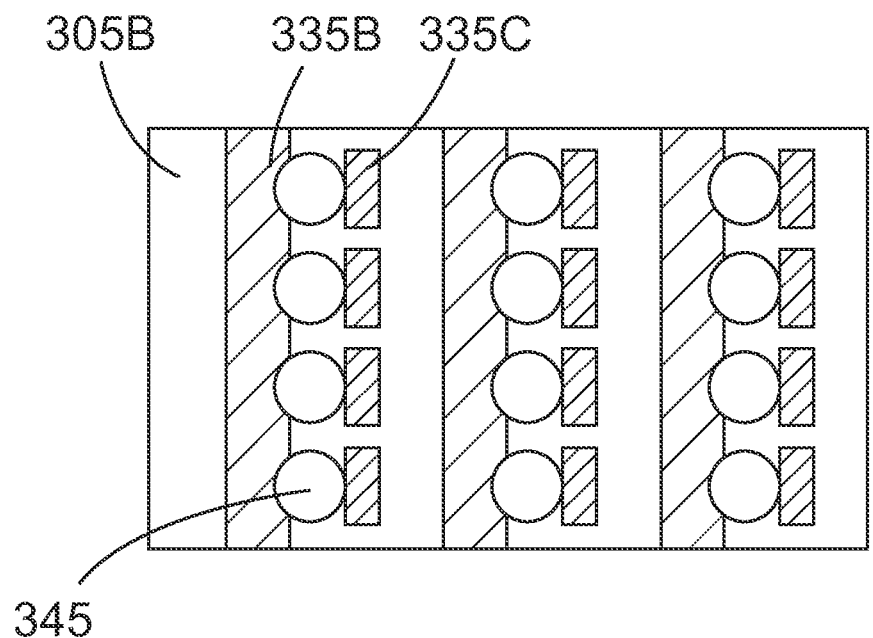

Then, a curing process 320 is performed on the conductive material 315 coated on the first transparent substrate 305A and the second transparent substrate 305B to form a first transparent conductive layer 325A and a second transparent conductive layer 325B on the surfaces of first transparent substrate 305A and the second transparent substrate 305B, respectively, wherein the curing process 320 further includes a baking process. Thereafter, a lithography process 330 is performed on the first transparent conductive layer 325A and the second transparent conductive layer 325B to convert the first transparent conductive layer 325A and the second transparent conductive layer 325B into specific patterns, forming at least one first transparent conductive region 335A on the first transparent substrate 305A, and at least one second transparent conductive region 335B and at least one third transparent conductive region 335C on the second transparent substrate 305B, wherein the lithography process 330 further includes an etching step. The at least one third transparent conductive region 335C and the at least one second transparent conductive region 335B are interspersed and spaced apart, as shown in FIG. 3C.

Then, an implantation process 340 is performed to form at least one LED 345 in the gap between the at least one third transparent conductive region 335C and the at least one second transparent conductive region 335B on the surface of the second transparent substrate 305B, wherein two electrodes of the at least one LED 345 are electrically coupled to the at least one third transparent conductive region 335C and the at least one second transparent conductive region 335B. Thereafter, an insulating process 350 is performed to form a transparent insulating layer 355 on the other surface of the first transparent substrate 305A, wherein the transparent insulating layer 355 is an OCA. Subsequently, a channeling process 360 is performed to sequentially penetrate the at least one first transparent conductive region 335A, the first transparent substrate 305A and the transparent insulating layer 355, forming a channel 365, wherein the location of the channel needs to correspond to the at least one third transparent conductive region 335C.

Then, an aligned adhering process 370 is performed to adhere the transparent insulating layer 355 of the first transparent substrate 305A with the at least one LED 345 of the second transparent substrate 305B, wherein the first transparent conductive region 335A and the second transparent conductive region 335B are spatially orthogonal to each other, and the first transparent conductive region 335A and the third transparent conductive region 335C form at least one spatial intersection in space, and the location of the channel 365 is on the at least one spatial intersection. Thereafter, an electrical conducting process 380 is performed to conduct the first transparent conductive region 335A and the third transparent conductive region 335C, wherein the electrical conducting process 380 further includes a filling step to fill the channel 365 with a conductor 385. The conductor can be silver gel. Finally, a protecting process 390 is performed to form a transparent protective layer 395 on the overall surface, thereby forming the LED display structure 300, wherein the material of the transparent protective layer 395 includes polyurethane (PU).

Figure 4A:
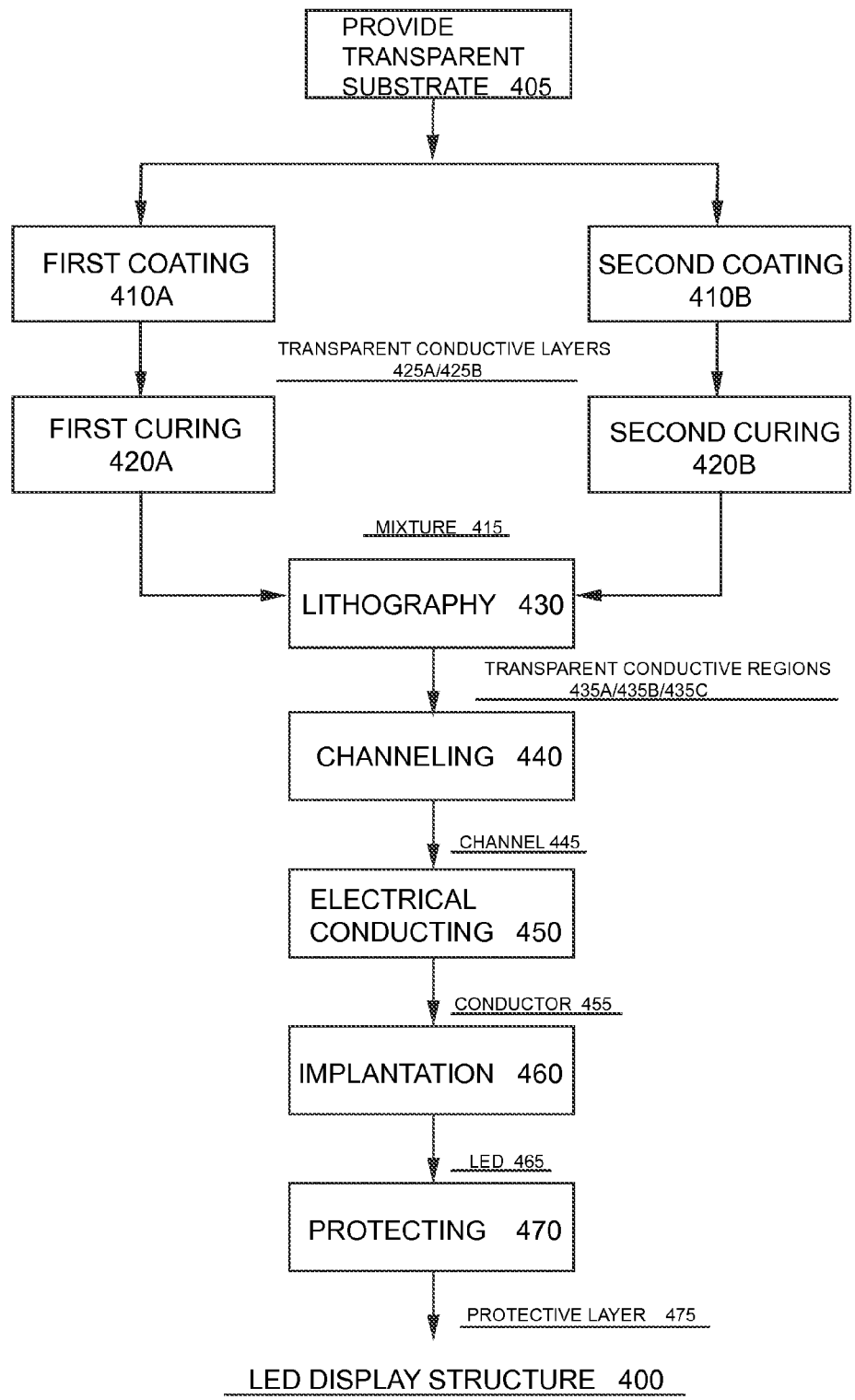
FIGS. 4A to 4C show a LED display structure and the method for forming it according to a fourth embodiment of the present invention.
Figure 4B:
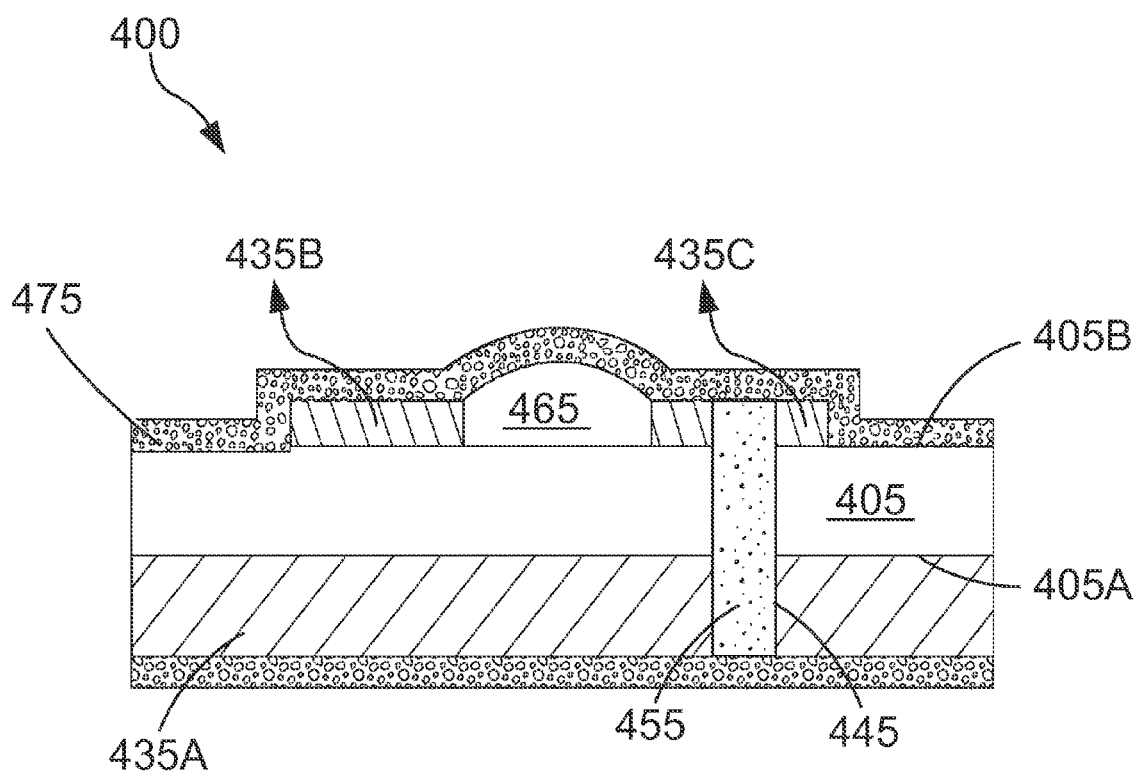

According to a fourth embodiment of the present invention, refer to FIGS. 4A and 4B, a LED display structure 400 and a method for forming it is provided. First, a transparent substrate 405 is provided. The material of the transparent substrate 405 includes PET. Then, a first coating process 410A is performed on a first surface 405A of the transparent substrate 405 to coat a conductive material 415 on the first surface 405A of the transparent substrate 405. Then, a first curing process 420A is performed on the conductive material 415 on the first surface 405A of the transparent substrate 405 to form a first transparent conductive layer 425A on the first surface 405A of the transparent substrate 405. Thereafter, a second coating process 410B is performed to coat the conductive material 415 on a second surface 405B of the transparent substrate 405, wherein the first surface 405A and the second surface 405B are two surfaces opposite to each other. Then, a second curing process 420B is performed on the conductive material 415 on the second surface 405B of the transparent substrate 405 to form a second transparent conductive layer 425B on the second surface 405B of the transparent substrate 405, wherein the first curing process 420A and the second curing process 420B each further includes a baking step.

The conductive material 415 includes PEDOT:PSS, a graphite structure and silicon oxide. PEDOT:PSS is a mixture of poly(3,4-ethylenedioxythiophene) and poly(styrenesulfonate), which makes up about 30%-70%, preferably 50-60% of the conductive material 415; the graphite structure further includes graphene and makes up about 15%-35%, preferably 20%-25% of the conductive material 415; and silicon oxide makes up about 15%-35%, preferably 20%-25% of the conductive material 415.

Figure 4C:
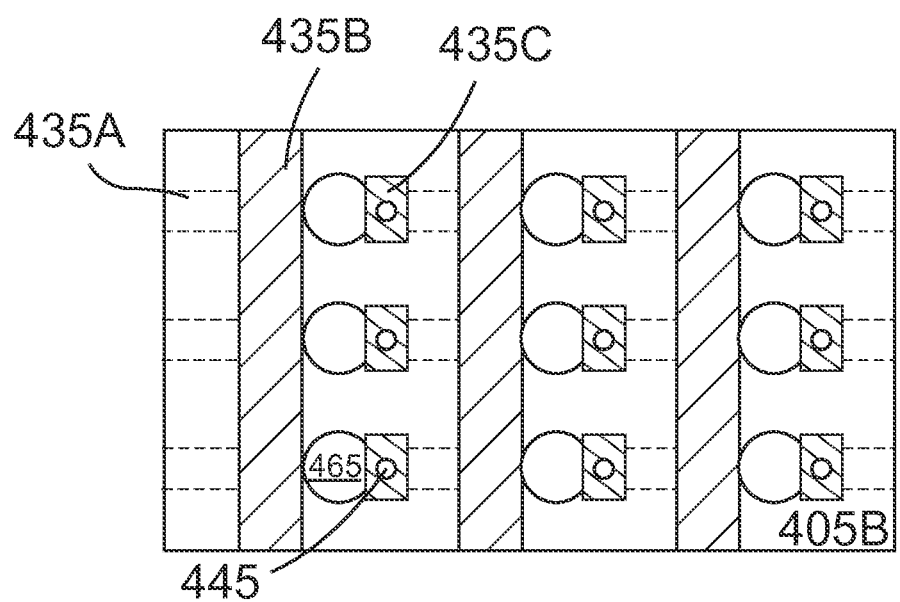

Thereafter, a lithography process 430 is performed on the first transparent conductive layer 425A and the second transparent conductive layer 425B to convert the first transparent conductive layer 425A and the second transparent conductive layer 425B into specific patterns, forming at least one first transparent conductive region 435A on the first surface 405A of the transparent substrate 405, and at least one second transparent conductive region 435B and at least one third transparent conductive region 435C on the second surface 405B of the transparent substrate 405, wherein the lithography process 430 further includes an etching step. The at least one third transparent conductive region 435C and the at least one second transparent conductive region 435B are interspersed and spaced apart, while the first transparent conductive region 435A and the second transparent conductive region 435B is spatially orthogonal to each other, and the first transparent conductive region 435A and the third transparent conductive region 435C form at least one spatial intersection in space, as shown in FIG. 4C.

Subsequently, a channeling process 440 is performed to sequentially penetrate the at least one first transparent conductive region 435A, the transparent substrate 405 and the at least one third transparent conductive region 435C, forming a channel 445 on the location of the at least one spatial intersection. Thereafter, an electrical conducting process 450 is performed to conduct the at least one first transparent conductive region 435A and the at least one third transparent conductive region 435C, wherein the electrical conducting process 450 further includes a filling step to fill the channel 445 with a conductor 455. The conductor can be silver gel.

Then, an implantation process 460 is performed to form at least one LED 465 in the gap between the at least one third transparent conductive region 435C and the at least one second transparent conductive region 435B on the second surface 405B of the transparent substrate 405, wherein two electrodes of the at least one LED 465 are electrically coupled to the at least one third transparent conductive region 435C and the at least one second transparent conductive region 435B, wherein the order in which the implantation process 460 and the channeling process 440 are performed can be changed as needed. Finally, a protecting process 470 is performed to form a transparent protective layer 475 on the overall surface, thereby forming the LED display structure 400, wherein the material of the transparent protective layer 475 includes polyurethane (PU).

Figure 5A:
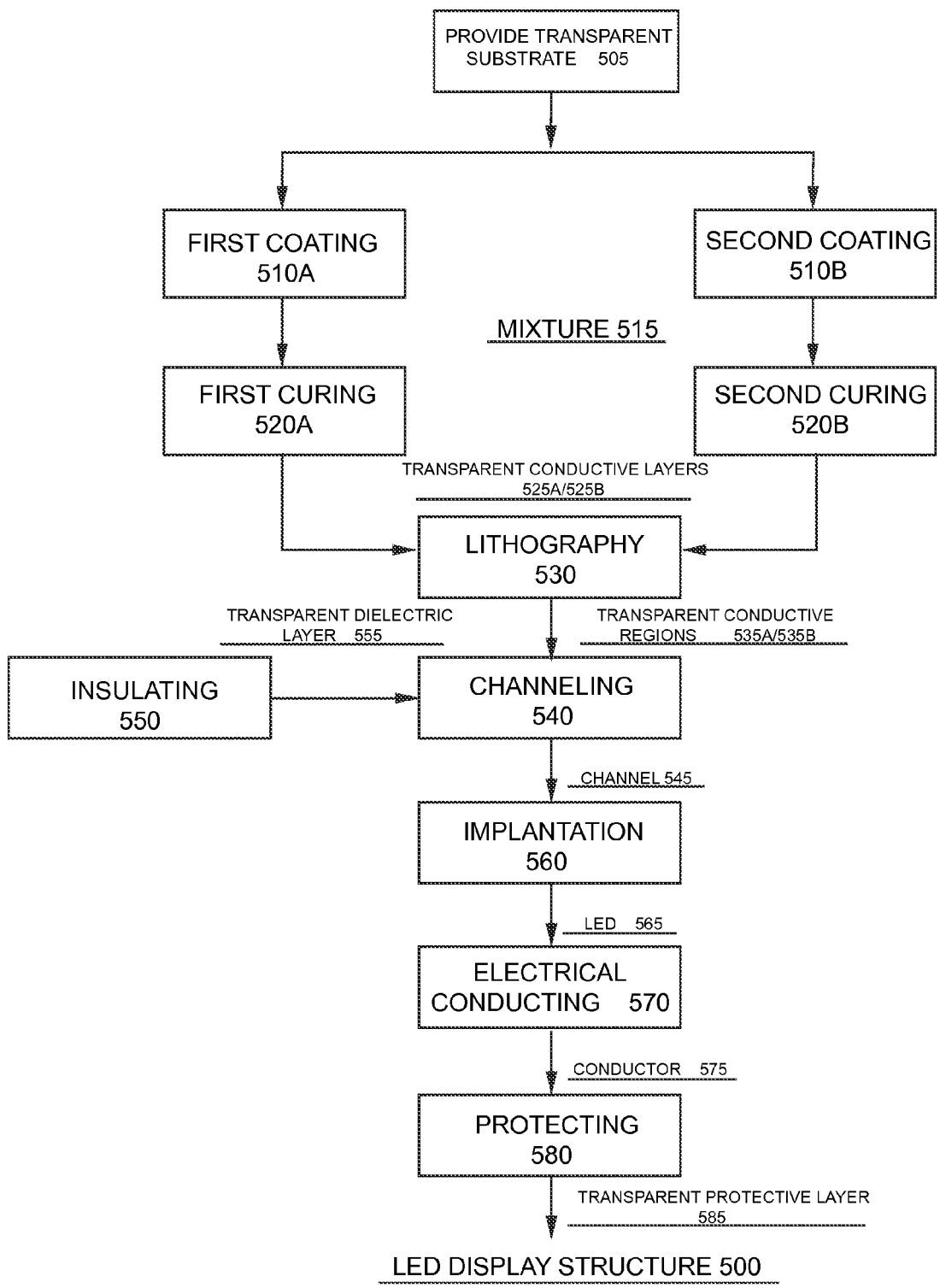
FIGS. 5A to 5C show a LED display structure and the method for forming it according to a fifth embodiment of the present invention.
Figure 5B:
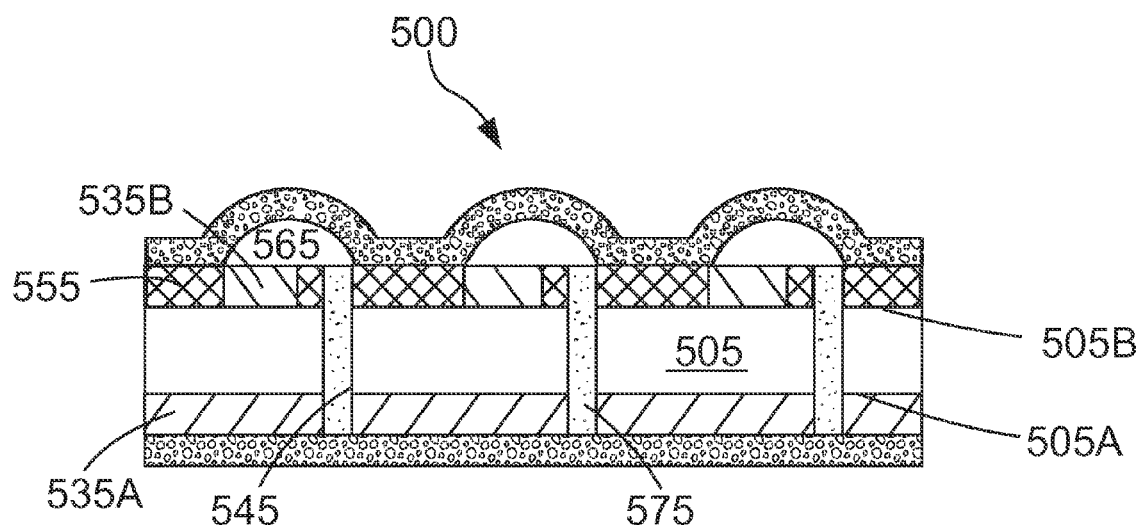

According to a fifth embodiment of the present invention, refer to FIGS. 5A and 5B, a LED display structure 500 and a method for forming it is provided. First, a transparent substrate 505 is provided. The material of the transparent substrate 505 includes PET. Then, a first coating process 510A is performed on a first surface 505A of the transparent substrate 505 to coat a conductive material 515 on the first surface 505A of the transparent substrate 505. Then, a first curing process 520A is performed on the conductive material 515 on the first surface 505A of the transparent substrate 505 to form a first transparent conductive layer 525A on the first surface 505A of the transparent substrate 505. Thereafter, a second coating process 510B is performed to coat the conductive material 515 on a second surface 505B of the transparent substrate 505, wherein the first surface 505A and the second surface 505B are two surfaces opposite to each other. Then, a second curing process 520B is performed on the conductive material 515 on the second surface 505B of the transparent substrate 505 to form a second transparent conductive layer 525B on the second surface 505B of the transparent substrate 505, wherein the first curing process 520A and the second curing process 520B each further includes a baking step.

The conductive material 515 includes PEDOT:PSS, a graphite structure and silicon oxide. PEDOT:PSS is a mixture of poly(3,4-ethylenedioxythiophene) and poly(styrenesulfonate), which makes up about 30%-70%, preferably 50-60% of the conductive material 515; the graphite structure further includes graphene and makes up about 15%-35%, preferably 20%-25% of the conductive material 515; and silicon oxide makes up about 15%-35%, preferably 20%-25% of the conductive material 515.

Figure 5C:
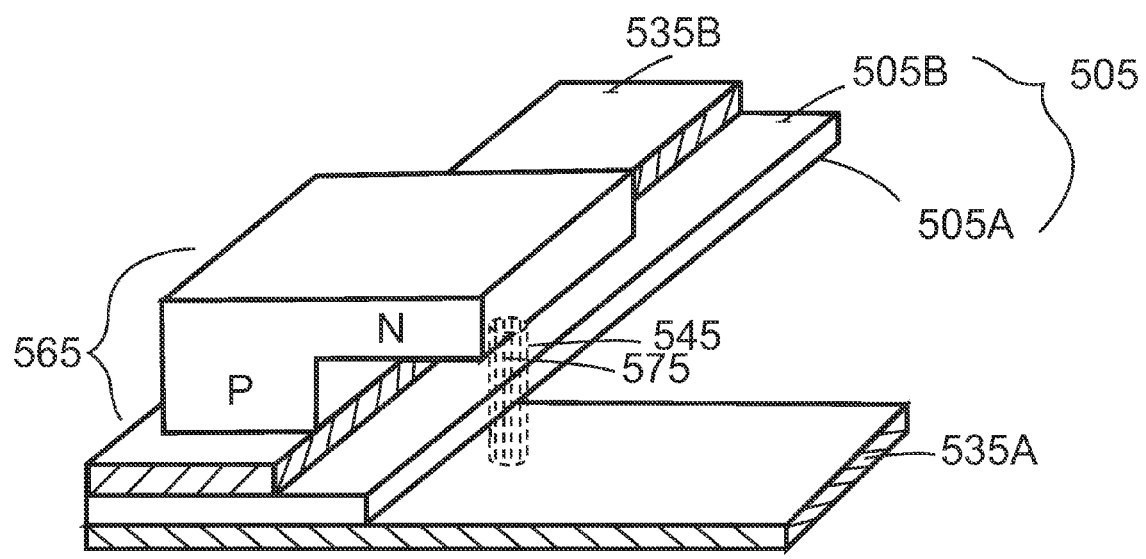

Thereafter, a lithography process 530 is performed on the first transparent conductive layer 525A and the second transparent conductive layer 525B to convert the first transparent conductive layer 525A and the second transparent conductive layer 525B into specific patterns, forming at least one first transparent conductive region 535A on the first surface 505A of the transparent substrate 505, and at least one second transparent conductive region 535B on the second surface 505B of the transparent substrate 505, wherein the lithography process 530 further includes an etching step. The first transparent conductive region 535A and the second transparent conductive region 535B is spatially orthogonal to each other, forming at least one spatial intersection in space, as shown in FIG. 5C.

A channeling process 540 is performed to sequentially penetrate the at least one first transparent conductive region 535A and the transparent substrate 505 to form a channel 545 on a location adjacent to the at least one second transparent conductive region 535B. In addition, according to the requirements of the manufacturing processes, before the channeling process 540, an insulating process 550 can be performed to form at least one transparent dielectric layer 555 between the at least one second transparent conductive region 535B on the at least one second transparent conductive region 535B of the second surface 505B of the transparent substrate 505, and the material of the transparent dielectric layer 555 can be an optical clear adhesive (OCA). If the LED display structure 500 has at least one transparent dielectric layer 555, then the channeling process 540 sequentially penetrates the at least one first transparent conductive region 535A, the transparent substrate 505 and the transparent dielectric layer 555 to form the channel 545. Then, an implantation process 560 is performed to form at least one LED 565 on the at least one second transparent conductive region 535B, wherein the order in which the implantation process 560 and the channeling process 540 are performed can be changed as needed.

Thereafter, an electrical conducting process 570 is performed to conduct the at least one first transparent conductive region 535A and an electrode of the at least one LED 565, wherein the electrical conducting process 570 further includes a filling step to fill the channel 545 with a conductor 575. The conductor can be selected according to the manufacturing process. If the transparent dielectric layer 555 is present, then silver gel can be used. If no transparent dielectric layer 555 is present, a rigid conductor can be selected, such as a copper wire or a conductive pin. As a result, two electrodes of the at least one LED 565 are electrically coupled to the at least one second transparent conductive region 535B and the conductor 575 of the at least one channel 545, respectively, as shown in FIG. 5C. Finally, a protecting process 580 is performed to form a transparent protective layer 585 on the overall surface, thereby forming the LED display structure 500, wherein the material of the transparent protective layer 585 includes polyurethane (PU).

According to the above embodiments, the first conductive region and the second conductive region have line structures and are spatially orthogonal to each other, thus forming rectangular LED matrix structure that can be independently driven. The orthogonal LED structure constitutes pixels of the display. If the electrodes of the first conductive region and the second conductive region are connected to a power supply, then light-emitting pixels are formed at or adjacent to the intersections of these electrodes. Basically, any pixel shapes are possible, such that a split display for displaying icons or simple pictures can be formed, for example. Moreover, the present invention can be applicable to active matrix structure in addition to passive matrix structure.

In addition, in view of the traditionally used PEDOT:PSS material having shortcomings such as poor environmentally stability, resistance drift, insufficient transparency, low wear resistance and poor adhesion, the conductive material proposed by the present invention achieves high transparency, wear resistance and low and stable resistance. The transparent conductive layer formed by such conductive material has the excellent characteristic of being very flexible. Thus, the LED display structures formed by such conductive material are flexible and transparent, which can be widely used in the LED-related industry. An intelligent display window is one example. If an advertisement is to be displayed, the LED display structure of the present invention can be used to show the advertisement in a minimum occupying space. When it is turned off, the window becomes a transparent window.

It is apparent that based on the above descriptions of the embodiments, the present invention can have numerous modifications and alterations, and they should be construed within the scope of the following claims. In addition to the above detailed descriptions, the present invention can be widely applied to other embodiments. The above embodiments are merely preferred embodiments of the present invention, and should not be used to limit the present invention in any way. Equivalent modifications or changes can be made by those with ordinary skill in the art without departing from the scope of the present invention as defined in the following appended claims.

What is claimed is:

1. A method for forming a light-emitting diode (LED) display structure, comprising:
    forming a first transparent conductive layer and a second transparent conductive layer on specific surfaces of at least one transparent substrate, where the materials of the first transparent conductive layer and the second transparent conductive layer further include polyethylene terephthalate (PET);
    performing a lithography process on the first transparent conductive layer and the second transparent conductive layer to convert them into specific patterns, forming at least one first transparent conductive region and at least one second transparent conductive region spatially orthogonal to each other to form at least one spatial intersection; and
    forming at least one LED electrically coupled to the at least one first transparent conductive region and the at least one second transparent conductive region.

2. The method for forming a LED display structure of claim 1, wherein the first transparent conductive layer and the second transparent conductive layer are formed by a conductive material including a mixture of poly(3,4-ethylenedioxythiophene) and poly(styrenesulfonate) (PEOT:PSS), a graphite structure and silicon oxide.

3. The method for forming a LED display structure of claim 2, wherein the PEOT:PSS mixture makes up about 30% to 70% of the conductive material, the graphite structure makes up about 15% to 35% of the conductive material, and the silicon oxide makes up about 15% to 35% of the conductive material.

4. The method for forming a LED display structure of claim 3, wherein the PEOT:PSS mixture makes up about 50% to 60% of the conductive material, the graphite structure makes up about 20% to 25% of the conductive material, and the silicon oxide makes up about 20% to 25% of the conductive material.

5. The method for forming a LED display structure of claim 2, wherein the graphite structure further includes graphene.

6. The method for forming a LED display structure of claim 1, further comprising:
the at least one transparent substrate including a first transparent substrate and a second transparent substrate;
forming the first transparent conductive layer and the second transparent conductive layer on surfaces of the first transparent substrate and the second transparent substrate;
performing a lithography process on the first transparent conductive layer and the second transparent conductive layer to convert them into specific patterns, forming the at least one first transparent conductive region and the at least one second transparent conductive region on the first transparent substrate and the second transparent substrate;
performing an implantation process to form the at least one LED on the at least one first transparent conductive region of the first transparent substrate; and
performing an aligned adhering process to adhere the first transparent substrate and the second transparent substrate with a receiving space formed therebetween, wherein the at least one spatial intersection is in the receiving space, and the at least one LED is on the on the spatial intersection.

7. The method for forming a LED display structure of claim 6, further comprising performing an insulating process to fill the receiving space with a transparent insulating layer.

8. The method for forming a LED display structure of claim 6, further comprising performing a positioning step to form at least one recess in the at least one second transparent conductive region at a location corresponding to the at least one LED for receiving the at least one LED.

9. The method for forming a LED display structure of claim 1, further comprising:
the at least one transparent substrate including a first transparent substrate and a second transparent substrate;
forming the first transparent conductive layer and the second transparent conductive layer on surfaces of the first transparent substrate and the second transparent substrate;
performing a lithography process on the first transparent conductive layer and the second transparent conductive layer to convert them into specific patterns, forming the at least one first transparent conductive region on the first transparent substrate, and the at least one second transparent conductive region and at least one third transparent conductive region on the second transparent substrate;
performing an implantation process to form the at least one LED in a gap between the at least one third transparent conductive region and the at least one second transparent conductive region on the surface of the second transparent substrate, wherein two electrodes of the at least one LED are electrically coupled to the at least one third transparent conductive region and the at least one second transparent conductive region, respectively;
performing a channeling process to sequentially penetrate the at least one first transparent conductive region and the first transparent substrate to form at least one channel, and the location of the at least one channel corresponding to the location of the at least one third transparent conductive region, and the at least one first transparent conductive region and the at least one third transparent conductive region being electrically coupled via the at least one channel; and
performing an aligned adhering process to adhere the first transparent substrate and the second transparent substrate with a receiving space formed therebetween, wherein the at least one spatial intersection is in the receiving space, and the at least one channel is on the on the at least one spatial intersection.

10. The method for forming a LED display structure of claim 9, further comprising performing an insulating process to fill the receiving space with a transparent insulating layer.

11. The method for forming a LED display structure of claim 9, wherein the at least one third transparent conductive region and the at least one second transparent conductive region are interspersed and spaced apart, and the number of the at least one third transparent conductive region equals to the number of the at least one LED.

12. The method for forming a LED display structure of claim 9, further comprising performing an electrically conducting process to fill the channel with a conductor.

13. The method for forming a LED display structure of claim 1, further comprising:
forming the first transparent conductive layer and the second transparent conductive layer on a first surface and a second surface of the at least one transparent substrate, respectively, wherein the first and the second surfaces are two surface opposite to each other;
performing a lithography process on the first transparent conductive layer and the second transparent conductive layer to convert them into specific patterns, forming the at least one first transparent conductive region on the first surface of the at least one transparent substrate, and the at least one second transparent conductive region and at least one third transparent conductive region on the second surface of the at least one transparent substrate;
performing a channeling process to sequentially penetrate the at least one first transparent conductive region, the at least one transparent substrate and the at least one third transparent conductive region to form at least one channel, and the at least one first transparent conductive region and the at least one third transparent conductive region being electrically coupled via the at least one channel; and
performing an implantation process to form the at least one LED in a gap between the at least one third transparent conductive region and the at least one second transparent conductive region on the second surface of the at least one transparent substrate, wherein the at least one LED is electrically coupled to the at least one third transparent conductive region and the at least one second transparent conductive region.

14. The method for forming a LED display structure of claim 13, wherein the at least one third transparent conductive region and the at least one second transparent conductive region are interspersed and spaced apart, and the number of the at least one third transparent conductive region equals to the number of the at least one LED.

15. The method for forming a LED display structure of claim 13, further comprising performing an electrically conducting process to fill the at least one channel with a conductor.

16. The method for forming a LED display structure of claim 1, further comprising:
forming the first transparent conductive layer and the second transparent conductive layer on a first surface and a second surface of the at least one transparent substrate, respectively, wherein the first and the second surfaces are two surface opposite to each other;

performing a lithography process on the first transparent conductive layer and the second transparent conductive layer to convert them into specific patterns, forming the at least one first transparent conductive region on the first surface of the at least one transparent substrate, and the at least one second transparent conductive region on the second surface of the at least one transparent substrate;

performing a channeling process to sequentially penetrate the at least one first transparent conductive region and the at least one transparent substrate to form at least one channel adjacent to the at least one second transparent conductive region, and performing an implantation process to form the at least one LED on the at least one second transparent conductive region, wherein an electrode of the at least one LED is electrically coupled to the at least one second transparent conductive region, and the other electrode of the at least one LED is electrically coupled to the at least one first transparent conductive region.

17. The method for forming a LED display structure of claim 16, further comprising performing an electrically conducting process to fill the at least one channel with a conductor.

18. The method for forming a LED display structure of claim 16, wherein before the channel process is performed, an insulating process is performed to form at least one transparent dielectric layer between the at least one second transparent conductive region on the second surface of the transparent substrate, wherein the at least one channel sequentially penetrates the at least one first transparent conductive region, the transparent substrate and the transparent dielectric layer.

* * * * *